United States Patent [19]

Houston et al.

[11] 3,979,769

[45] Sept. 7, 1976

[54] GATE MODULATED BIPOLAR TRANSISTOR

[75] Inventors: Douglas E. Houston; Surinder Krishna, both of Ballston Lake; Bantval Jayant Baliga, Schenectady, all of N.Y.

[73] Assignee: General Electric Company, Schenectady, N.Y.

[22] Filed: Oct. 16, 1974

[21] Appl. No.: 515,164

[52] U.S. Cl.................................. 357/57; 357/34; 357/36
[51] Int. Cl.² ................. H01L 29/72; H01L 29/66
[58] Field of Search........................ 357/34, 36, 57

[56] References Cited
UNITED STATES PATENTS 3,335,296  8/1967  Smart.................................. 357/57
3,760,239  9/1973  Fletcher et al...................... 357/34

Primary Examiner—Edward J. Wojciechowicz
Attorney, Agent, or Firm—Donald M. Winegar; Joseph T. Cohen; Jerome C. Squillaro

[57] ABSTRACT

A Gate Modulated BiPolar Transistor, or GAMBIT, is a three terminal negative resistance device. A load is connected between the emitter and collector terminals and the magnitude of the negative resistance is controlled by the voltage on the gate terminal. An increase in the output voltage modulates the resistance of the gate which decreases the output current.

12 Claims, 16 Drawing Figures

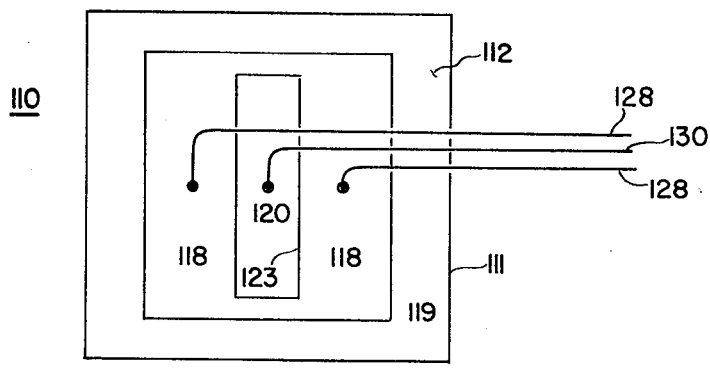
*Fig.12*
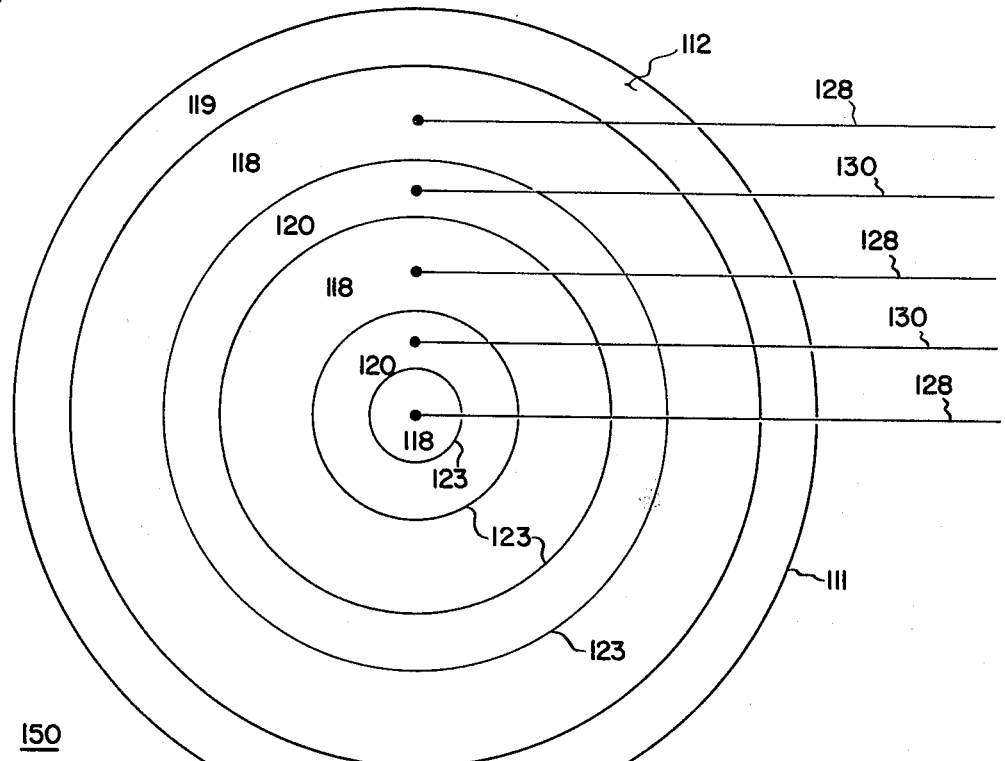
*Fig.13*
*Fig.14*

GATE MODULATED BIPOLAR TRANSISTOR

BACKGROUND OF THE INVENTION

1. Field of the Invention

This invention relates to a method of controlling negative resistances in a circuit, and in particular, to a gate modulated bipolar transistor which functions as a three terminal negative resistance device.

2. Background of the Invention

Heretofore, most negative resistance devices have had only two terminals. These devices have been used in microwave oscillator circuits. However, such present devices have several disadvantages. One disadvantage is that the circuit must be designed around the particular value of the resistance of the two terminal device to be used in the circuit. A second disadvantage is that these present two terminal devices are limited to moderate power circuit applications since the magnitude of the resistances range from a few tens to a few hundreds of ohms. A third disadvantage of present day devices is that the magnitude of the negative resistance is susceptable to thermal instability and required complex circuitry for biasing the same.

An object of this invention is to provide a new and improved negative resistance device which overcomes the deficiencies of prior art devices.

Another object of this invention is to provide a new and improved negative resistance device which includes means for controlling the magnitude of the negative resistance thereof.

A further object of this invention is to provide a three terminal negative resistance device wherein the magnitude of the negative resistance is controlled by the voltage impressed on a control electrode of the device.

Other objects of this invention will, in part, be obvious and will, in part, appear hereinafter.

BRIEF DESCRIPTION OF THE INVENTION

In accordance with the teachings of this invention, there is provided a gate modulated bipolar transistor comprising a body of semiconductor material having two major opposed surfaces which are the top and bottom surfaces thereof. The body also contains two abutting regions of alternate and opposite conductivity. Each region has a selected resistivity and a major surface comprising at least in part a major surface of the body. One of the regions is the emitter region of the transistor. A first P-N junction is formed by the abutting surfaces of the two regions of opposite conductivity and is substantially parallel to the major surface of the body. At least one third region, the collector region, is formed in the other region of the body and has a selected resistivity and the same type conductivity as the emitter region. The collector region has a surface which comprises in part the top surface of the body. A second P-N junction is formed by the abutting surface of the other region of the body and each collector region. Each second P-N junction has an end portion which terminates in the top surface of the body. At least one gate region, located remote from the peripheral edge of the body, is integral with, and of the same conductivity type as, the other region of the body and has a surface coextensive with the surface of the collector region. The gate region is defined by a selected portion of at least one second P-N junction which has the end portion terminating in the top surface. Ohmic electrical contacts are affixed to each of the collector regions, to each of the gate regions, and to the emitter region. The transistor has the inherent capability to control the negative resistance thereof when a load is connected between the ohmic electrical contacts of the collector and emitter regions and a voltage is impressed on the ohmic electrical contact of the gate regions. The magnitude of the negative resistance of the transistor is modulated by varying the impressed voltage on the contact to the gate region.

DESCRIPTION OF THE DRAWINGS

FIG. 12 is a top planar view of an alternate embodiment of the transistor of FIG. 10;

FIG. 13 is a side view, in cross-section, of a further embodiment of a gate modulated bipolar transistor of FIG. 1 and made in accordance with the teachings of this invention;

FIG. 14 is a top planar view of the transistor of FIG. 13;

DESCRIPTION OF THE INVENTION

Figure 1:
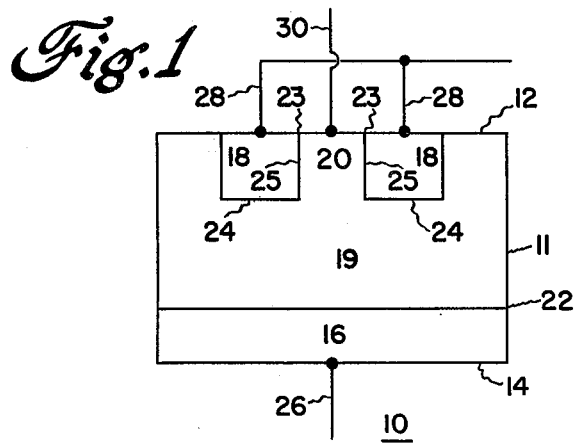
FIG. 1 is a side elevation view, in cross-section, of a gate modulated bipolar transistor made in accordance with the teachings of this invention.

With reference to FIG. 1, there is shown a GAte Modulated BIpolar Transistor (GAMBIT) 10 comprising a body 11 of single crystal semiconductor material having a selected resistivity and a first type conductivity. The body 10 has opposed major surfaces 12 and 14 which are the top and bottom surfaces respectively thereof. The semiconductor material comprising the body 10 may be silicon, germanium, silicon carbide, gallium arsenide, a semicoductor compound of a Group II element and Group VI element and a semiconductor compound of a Group III element and a Group V element.

The body 11 is processed by suitable standard semiconductor process techniques, where feasible, such, for example, as epitaxial growths of material, diffusion, ion implantation, temperature gradient zone melting, and the like. The resulting structure comprises an emitter region 16, at least one collector region 18 and a base region 19. The collector region 18 and the emitter region 16 are of the same type conductivity which is opposite to that type conductivity of the body 11 and the base region 19. P-N junctions 22 and 24 are formed by the abutting surfaces of the material of the regions 16, 18 and 19 of opposite type conductivity. The collector region 18 is disposed in the base region 19 and has a surface which is coextensive with the surface of the base region, the surfaces comprising the top surface 12 of the device. P-N junction 24 has at least one end portion 23 which is exposed in the top surface 12. A selective side surface 25 of the one or more collector regions 18 define a structure portion of the base region 20, which is a gate region 20. The gate region 20 has a surface coextensive with the surfaces of the collector regions 18 and the base region 19.

The dimensions of the body 11 and the regions 16, 18, 19 and 20 are determined by the magnitude of the negative resistance to be controlled and the material comprising the body 11. The thickness and resistivities of the regions 16 and 18 are determined by the operating characteristics of the completed device. The width of the gate region 20 is also determined by the operating characteristics of the completed device.

Ohmic electrical contacts 28 and 30 are affixed to the collector regions 18 and gate region 20 respectively to provide suitable means for connecting the GAMBIT into an external electrical circuit.

Figure 2:
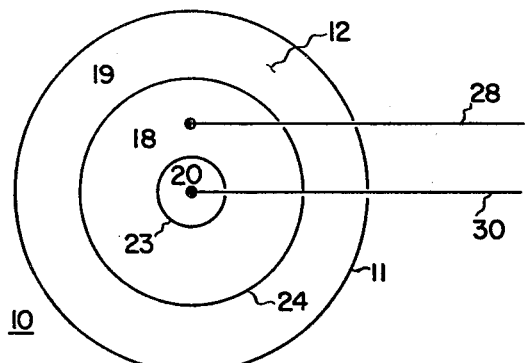
FIG. 2 is a top planar view of the transistor of FIG. 1.
Figure 3:
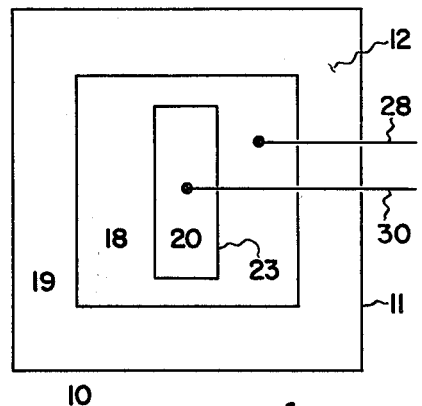
FIG. 3 is a top planar view of an alternate embodiment of the transistor of FIG. 1.

FIGS. 2 and 3 are illustrative of different configurations of the regions 18 and 20 of the GAMBIT 10. In FIG. 2, the collector region 18 is annular and encompasses the gate region 20 of the transistor 10. The end portion 23 of the P-N junction 24 terminates in the top surface 12 and defines the gate region 20 which is cylindrical in shape and integral with the base region 19 of the body 11. The collector and gate regions, 18 and 20 respectively, have surfaces which are coextensive with each other and comprise the top surface 12 of the body 11. The region 16, not shown, is the emitter region of the transistor 10.

Referring now to FIG. 3, the configuration of the transistor 10 has a rectangularly shaped gate region 20 defined by windows in the collector region 18. The emitter region 16, not shown, is as before and has a surface which comprises the bottom surface 14 of the body 11 and the transistor 10.

The GAte Modulated BIpolar Transistor, or GAMBIT, may be of N-P-N or a P-N-P configuration. Ohmic electrical contacts 26, 28 and 30 are affixed to the respective emitter region 16, collector region 18 and gate region 20 to enable the GAMBIT to be connected into electrical circuitry.

Figure 4:
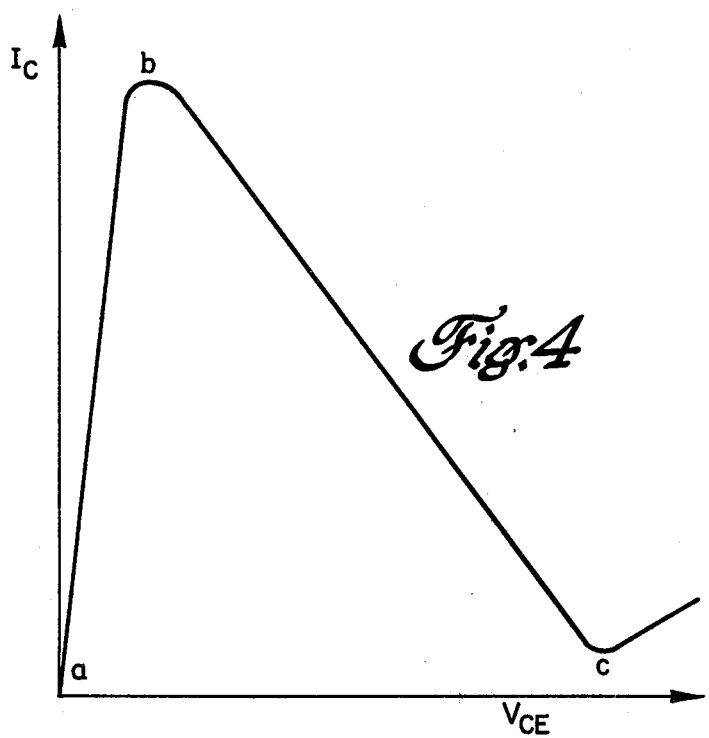
FIG. 4 is a graph of the $I_C$-$V_C$ characteristics of a transistor made in accordance with the teachings of this invention.
Figure 5:
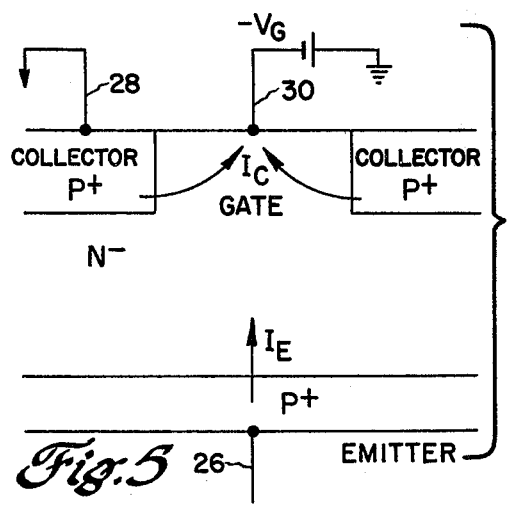
FIG. 5 is an illustration showing the current flow when the transistor of FIG. 5 is held in saturation.

Referring now to FIGS. 1, 4, 5 and 6, the operation of a $P^+$-$N^-$-$P^+$ configuration GAMBIT will be described. When the gate modulated bipolar transistor 10 is energized, the charge injected from the P-type emitter region 16 is controlled by the electron charge in the gate region 20. The electron current is in turn modulated by the collector-to-gate reverse biasing. When the GAMBIT is in saturation, the current flow therein is as shown in FIG. 5. In this saturation condition, both the emitter and the collector inject holes into the gate circuit such that $I_E + I_C = I_G$.

Figure 6:
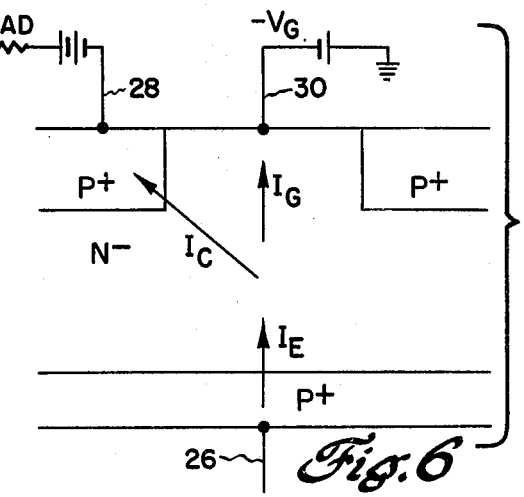
FIG. 6 is a schematic which illustrates the current flow of the transistor of FIG. 1 when the collector is reverse biased.

Upon the application of a reverse bias to the collector, as shown in FIG. 6, the GAMBIT is taken out of saturation. The emitter current $I_E$ is now shared between the collector region 18 and the gate region 20.

As the grounded emitter current gain $\beta$ of the GAMBIT is increased, the collector current $I_C$ increases to a maximum as shown by the portion of the curve ab of FIG. 4. As the collector current $I_C$ increases, the gate current $I_G$ is decreasing. The decrease in the gate current $I_G$ is the result of the increasing magnitude of the grounded emitter current gain $\beta$ of the GAMBIT.

As the magnitude of the gate-collector reverse bias continues to increase, the gate channel, region 20 defined by a selective portion 23 of the P-N junction 24 which terminate in the top surface 12, is pinched off by the increase in the depletion regions from the collector region 18. The net result of this action on the gate channel is to decrease the electron current flow to the gate contact 30. This action dominates over the increase in $\beta$, the gain of the transistor, and the collector and emitter currents begin to decrease. As the collector voltage, that is, the gate-collector reverse bias continues to increase, the emitter and collector currents continue to decrease as shown by the portion of the curve bc of FIG. 4. The magnitude of the negative resistance is determined by the gate voltage $V_G$.

Upon reaching the point of c of the curve of FIG. 4, the gate channel (base of the bipolar) is now pinched off. Any further increase in the gate-collector reverse bias will result in only a leakage current flow from the gate-collector junction region 24. The gate modulated bipolar transistor has been observed to have a controllable negative resistance which ranges from a few hundreds of ohms to several megohms.

Figure 7:
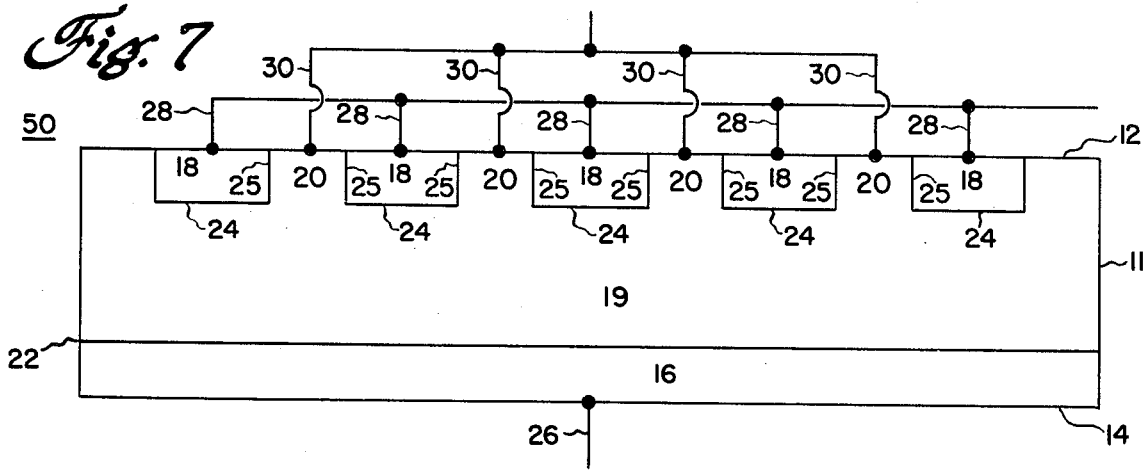
FIG. 7 is an elevation view, in cross-section, of an alternate embodiment of the transistor of FIG. 1.
Figure 8:
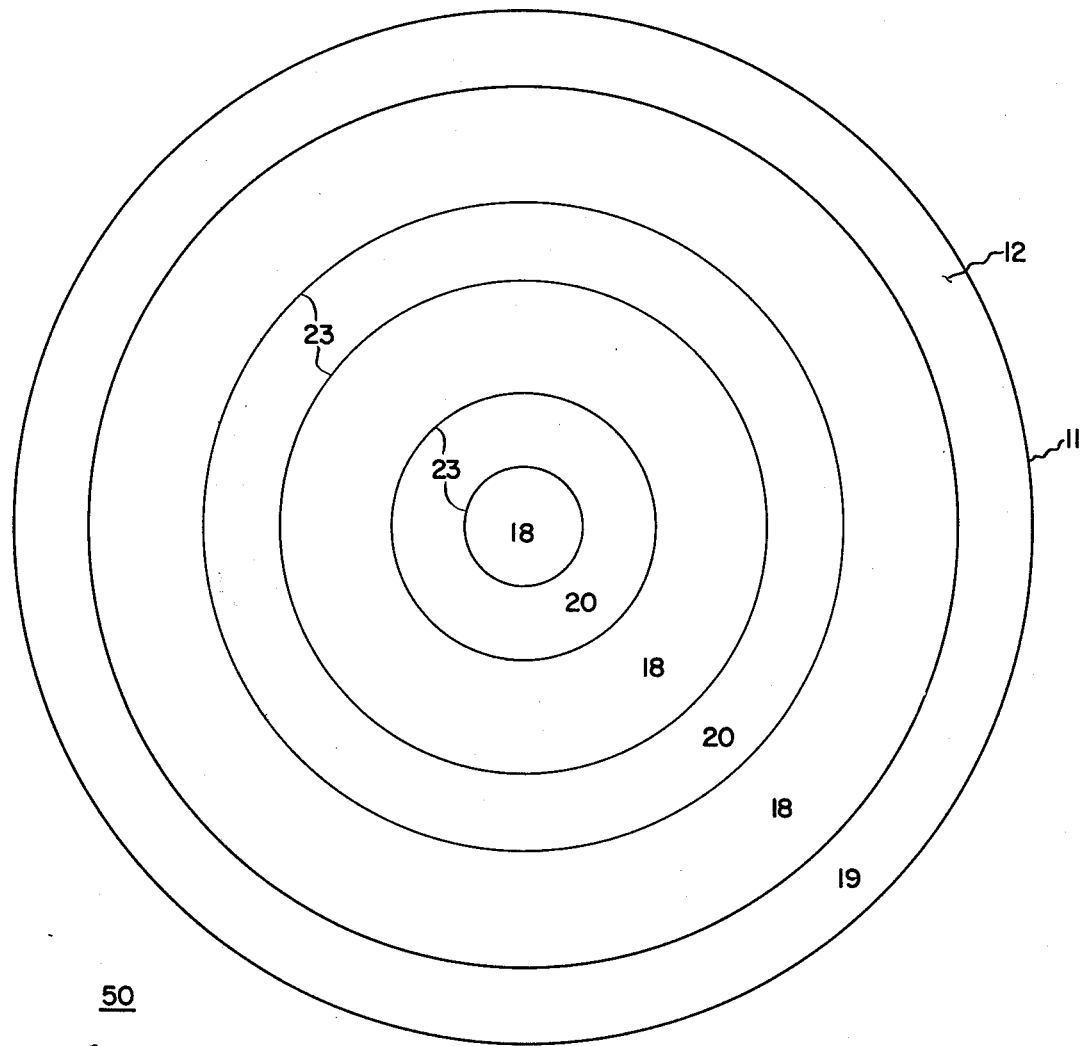
FIG. 8 is a top planar view of the transistor of FIG. 7.
Figure 9:
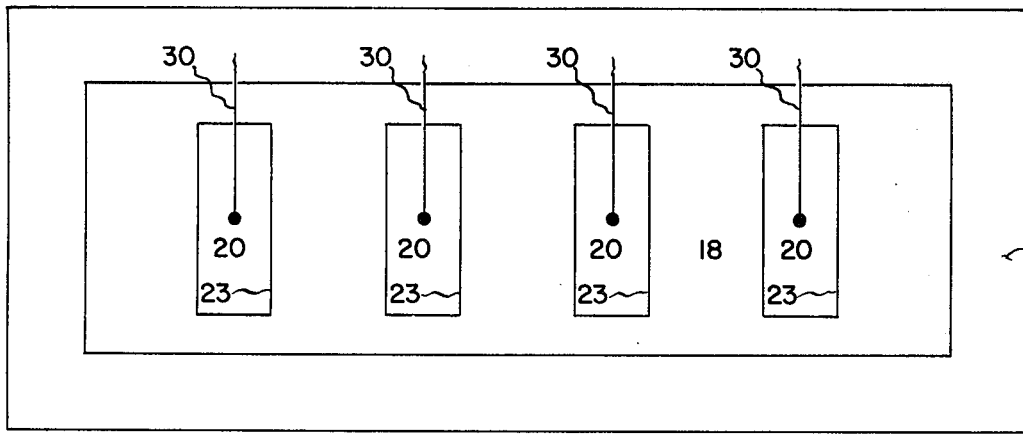
FIG. 9 is a top planar view of an alternate embodiment of the transistor of FIG. 7.

Referring now to FIG. 7, there is shown a GAte MOdulated BIpolar Transistor 50 which is an alternate embodiment of the gate modulated bipolar transistor of FIG. 1. The only difference is that the transistor 50 embodies a plurality of gate regions 20. All reference numbers which are the same as in FIG. 1, denote the same items which function in the same manner as described before. With reference to FIGS. 8 and 9, the regions 18 and 20 may be annular in configuration or of a rectangular configuration respectfully.

Figure 10:
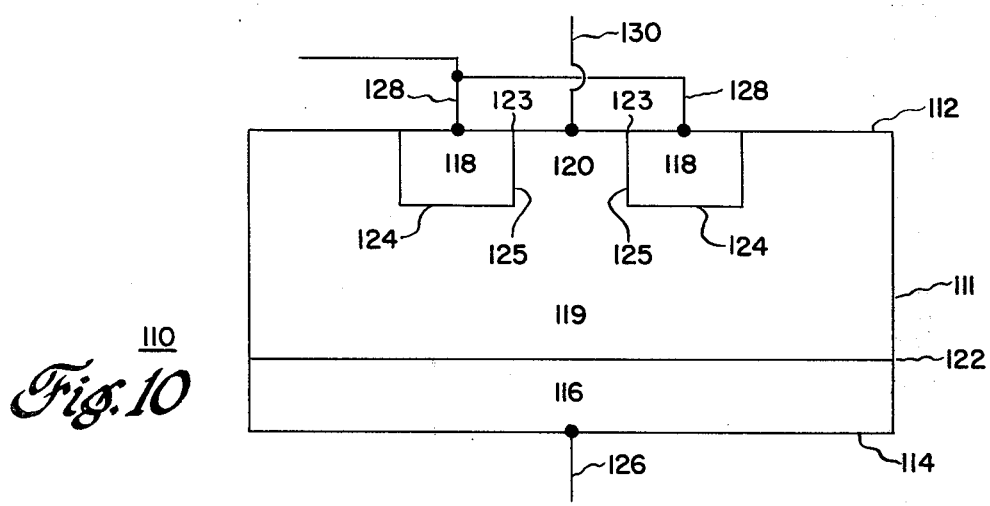
FIG. 10 is a side elevation view, in cross-section, of another embodiment of a gate modulated bipolar transistor of FIG. 1 and made in accordance with the teachings of this invention.

With reference to FIG. 10, there is shown a gate modulated bipolar transistor 110. The transistor 110 comprises a body 111 of single crystal semiconductor material having two major opposed surfaces 112 and 114 which are, respectively, the top and bottom surfaces of the transistor 110, an emitter region 116, a collector region 118 and a gate region 120. A P-N junction 124 is formed by the abutting surfaces of the regions 118 and 120 of opposite type conductivity. An end portion 123 of each P-N junction 124 terminates in, and is exposed, in the top surface 112. A selected portion 125 of each pair of mutually adjacent P-N junctions 124 defines the gate region 120 which is integral with the region 119 which comprises the original material of the body 111. The material comprising the body 111 is the same as that comprising the body 11 of transistor 10.

The transistor 110 differs from transistor 10 of FIG. 1 in that the material comprising the body 111, and therefore the gate region 119, and the material of the emitter region 116 are of different semiconductor materials. The semiconductor material of the body 111 and region 116 are selected so as to form a heterojunction 122 by the abutting surfaces of the regions of different material. For example, the body 111 may be of N-type silicon semiconductor material and the emitter 116 may be of gallium arsenide which is of $P^+$ material.

The emitter 116 may be formed by any suitable means known to those skilled in the art such, for example, as by the vapor deposition of the suitable material on a prepared surface of the material comprising the body 111. Preferably, the emitter region 116 is grown on the material of the body 111 before the collector region 118 is formed in the body 111 to define region 120. The collector 118 is formed by either diffusion, ion implantation, temperature gradient zone melting, and the like, or by other suitable semiconductor processing techniques well known to those skilled in the art.

An electrical lead 126 is affixed by an ohmic electrical contact to the emitter region 116. Electrical lead 128 is affixed by an ohmic electrical contact to the collector region 118. An electrical lead 130 is affixed by an ohmic electrical contact to the gate region 120.

The gate modulated bipolar transistor 110 functions in exactly the same manner as the transistors 10 and 50.

Figure 11:
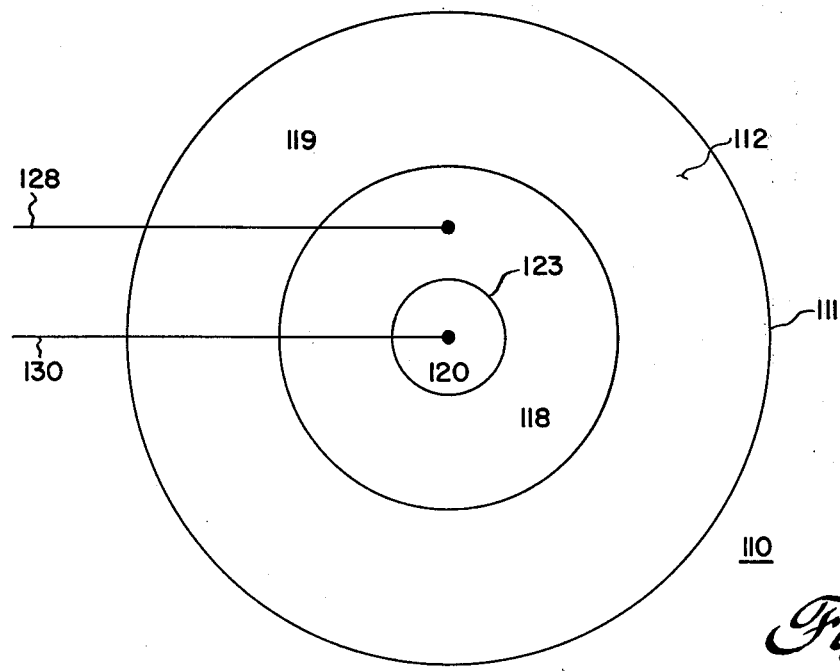
FIG. 11 is a top planar view of the transistor of FIG. 10.

Referring now to FIG. 11, the transistor 110 may have concentric annular collector and gate regions 118 and 120, respectively. Alternately, the transistor 110 may have a rectangular configuration for the collector region 118 with the gate region 120 therebetween as shown in FIG. 12.

With reference to FIG. 13, there is shown a gate modulated bipolar transistor 150 which is an alternate embodiment of the transistor 110. All reference numerals which are the same as in FIG. 10, denote items which are the same, and function in the same manner, as the same items of FIG. 10. The difference in the two transistors is that transistor 150 embodies a plurality of gate regions 120 defined by windows in collector region 118. The transistor 150 functions in exactly the same manner as the transistors 10, 50 and 110.

Figure 15:
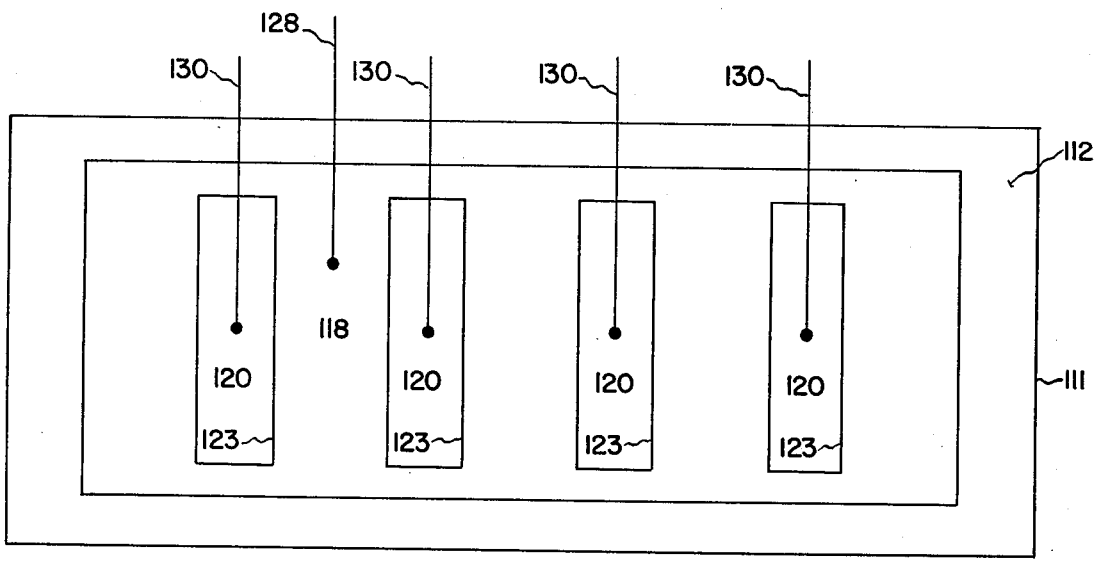
FIG. 15 is a top planar view of an alternate embodiment of the transistor of FIG. 13.

The collector and gate regions, 118 and 120, respectively, of the transistor 150 may be of a concentric annular region configuration as shown in FIG. 14. Alternately, with reference to FIG. 15, the configuration of the collector region 118 may be rectangular and the gate regions 120 are formed in between each pair of selected adjacent portions of the regions 118 and defined by a selective portion 125 of the P-N junction 124 terminating in the surface 112.

Preferably, the gate-modulated bipolar transistor is fabricated in a manner wherein the collector region and gate region utilizes the maximum volume of the body of semiconductor material. In such cases where the collector region is fabricated as close to the outer peripheral surface of the body as possible, means must be provided to protect the electrical integrity of the P-N junctions formed therein.

Figure 16:
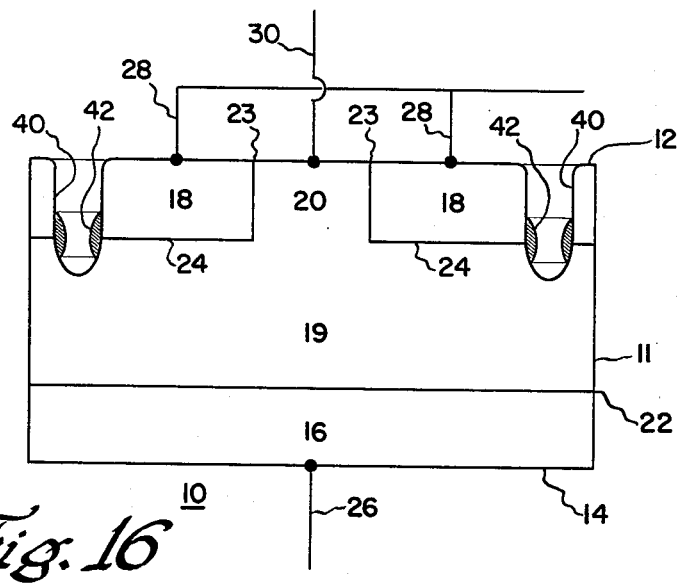
FIG. 16 is a side elevation view, in cross-section, of a modification of the transistor of FIG. 1 made in accordance with the teachings of this invention.

For example, with reference to FIG. 16, the device 10 of FIG. 1 is modified wherein the collector region 18 is disposed in the surface 12 of the body 11 encompassing the ohmic contact affixed to lead 30. Employing selective chemical etching, a moat defined by walls 40 is formed in the outer peripheral surface portion of the top surface 12 and extends downward a sufficient distance to expose the P-N junction 24 therein. A layer 42 of an electrical insulating material such, for example, as silicon oxide, silicon nitride, rubber-like coatings and the like are disposed on the exposed portions of the P-N junction 24 to protect the electrical integrity thereof.

The gate modulated bipolar transistor of this invention is suitable for applications as a circuit element from DC to the microwave region.

We claim as our invention:
1. A gate modulated bipolar transistor including:
   an emitter region, at least one collector region and at least one gate region integral with a base region;
   a first region of a first type conductivity as the base region;
   a second region having a second type conductivity as the emitter region;
   the first region having two opposed major surfaces;
   the second region having two opposed major surfaces;
   the major opposed surfaces being the top and bottom surfaces of the respective regions;
   the top surface of the second region being coextensive and contiguous with the bottom surface of the first region;
   a first P-N junction between the top surface of the second region and the bottom surface of the first region;
   at least one first ohmic electrical contact centrally, disposed upon the top surface of the first region;
   at least two spaced third regions having second type conductivity as collector regions disposed in a portion of the top surface of the first region wherein the first ohmic contact is centrally disposed therebetween and each region having a selected surface opposed to a selective surface of the other thereby defining the gate region of the device;
   a second P-N junction between each third and first regions;
   a second ohmic electrical contact affixed to the bottom surface of the second region; and
   a third ohmic electrical contact affixed to each of the third regions, and wherein
   when a variable voltage source, operating between predetermined limits, is connected to the first ohmic contact to drive the gate region and a reverse bias is applied to the collector via the third contacts, an increase in the gate-collector reverse bias decreases the emitter and collector currents and the transistor functions as a negative resistance element, the magnitude of which is modulated by the variable voltage source.
2. The transistor of claim 1 wherein
   the third regions are integral with each other to form one region which has an annular configuration which encompasses the gate region.
3. The transistor of claim 2 and including
   a plurality of spaced concentric annular third regions disposed in the top surface portion of the first region defining a plurality of spaced annular gate regions;
   a plurality of first ohmic electrical contacts, each first contact being affixed to a respective one of the gate regions, and
   a plurality of third ohmic electrical contacts, each third electrical contact being affixed to a respective one of the plurality of third regions.
4. The transistor of claim 1 including
   walls defining an annular moat in the outer peripheral portion of the transistor and extending downward from the top surface of the first region to at least intersect, and expose therein, the first P-N junction, and
   a layer of electrically insulating material disposed on the exposed portions of the first P-N junction in the trough.
5. The transistor of claim 1 wherein a plurality of third regions are disposed in the portion of the top surface to define a plurality of gate regions, and a plurality of first contacts, each contact is disposed upon a respective gate region defined by a pair of third regions.

6. The transistor of claim 5 wherein each third region has a rectangular configuration and each gate region has a rectangular configuration.

7. An electrical circuit including two electrical terminals;

a power source;

a first electrical circuit means connected between the two electrical terminals and connecting the power source to the electrical load;

a gate modulated bipolar transistor including an emitter region and at least one collector region and at least one gate region integral with a base region;

a first region of a first type conductivity as the base region;

a second region having a second type conductivity as the emitter region;

the first region having two opposed major surfaces;

the second region having two opposed major surfaces;

the major opposed surfaces being the top and bottom surfaces of the respective regions;

the top surface of the second region being coextensive and contiguous with the bottom surface of the first region;

a first P-N junction between the top surface of the second region and the bottom surface of the first region;

at least one first ohmic electrical contact centrally disposed upon the top surface of the first region;

at least two spaced third regions having second type conductivity as collector regions disposed in a portion of the top surface of the first region wherein the first ohmic contact is centrally disposed therebetween and each region having a selected side surface opposed to a selective side surface of the other thereby defining the gate region of the device;

a second P-N junction between each third and first regions;

a second ohmic electrical contact affixed to the bottom surface of the second region; and a third ohmic electrical contact affixed to each of the third regions;

a second electrical means connecting the collector region to one of the electrical terminals;

a third electrical means connecting the emitter region to the other of the electrical terminals, and a variable voltage source, operating between predetermined limits, connected to drive the at least one gate region, wherein when a reverse bias is applied to the collector an increase in the gate-collector reverse bias decreases the emitter and collector currents and the transistor functions as a negative resistance element, the magnitude of which is modulated by the variable voltage source.

8. The transistor of claim 7 wherein the third regions are integral with each other to form one region which has an annular configuration which encompasses the gate region.

9. The transistor of claim 8 and including a plurality of spaced concentric annular third regions disposed in the top surface portion of the first region defining a plurality of spaced annular gate regions;

a plurality of first ohmic electrical contacts, each first contact being affixed to a respective one of the gate regions, and a plurality of third ohmic electrical contacts, each third electrical contact being affixed to a respective one of the plurality of third regions.

10. The transistor of claim 7 wherein a plurality of third regions are disposed in the portion of the top surface to define a plurality of gate regions, and a plurality of first contacts, each contact is disposed upon a respective gate region defined by a pair of third regions.

11. The transistor of claim 10 wherein each third region has a rectangular configuration and each gate region has a rectangular configuration.

12. The transistor of claim 7 including walls defining an annular moat in the outer peripheral portion of the transistor and extending downward from the top surface of the first region to at least intersect, and expose therein, the first P-N junction, and a layer of electrically insulating material disposed on the exposed portions of the first P-N junction in the trough.

* * * * *